United States Patent
Yang

(10) Patent No.: US 9,761,490 B2
(45) Date of Patent: Sep. 12, 2017

(54) METHOD FOR FORMING CONTACT HOLES IN A SEMICONDUCTOR DEVICE

(71) Applicant: SEMICONDUCTOR MANUFACTURING INTERNATIONAL (SHANGHAI) CORPORATION, Shanghai (CN)

(72) Inventor: Yun Yang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 1 day.

(21) Appl. No.: 14/879,066

(22) Filed: Oct. 8, 2015

(65) Prior Publication Data

US 2016/0104641 A1    Apr. 14, 2016

(30) Foreign Application Priority Data

Oct. 9, 2014 (CN) .......................... 2014 1 0527831

(51) Int. Cl.
*H01L 21/4763* (2006.01)
*H01L 21/768* (2006.01)
*H01L 27/11521* (2017.01)

(52) U.S. Cl.
CPC .. *H01L 21/76897* (2013.01); *H01L 21/76837* (2013.01); *H01L 27/11521* (2013.01); *H01L 2924/0002* (2013.01)

(58) Field of Classification Search
CPC ............. H01L 21/76897; H01L 21/304; H01L 2224/49107; H01L 31/1892; H01L 27/1052

USPC ................................................ 438/622, 637
See application file for complete search history.

(56) References Cited

U.S. PATENT DOCUMENTS

| | | | |
|---|---|---|---|
| 2009/0137126 A1* | 5/2009 | Kim .................. | H01L 21/30617 438/703 |
| 2011/0104889 A1* | 5/2011 | Lee .................. | H01L 21/76831 438/637 |
| 2016/0181316 A1* | 6/2016 | Lee ....................... | H01L 27/222 711/125 |
| 2016/0204030 A1* | 7/2016 | Bai .................. | H01L 21/76897 438/586 |

* cited by examiner

*Primary Examiner* — Sheila V. Clark
(74) *Attorney, Agent, or Firm* — Kilpatrick Townsend & Stockton LLP

(57) ABSTRACT

A method for forming a semiconductor device includes forming a device structure having a floating gate, control gate, sidewall spacers, and source and drain regions. The device structure includes contact-hole regions and non-contact-hole regions. The method also includes forming a photo resist layer overlying the contact hole regions in the device structure and exposing the non-contact-hole regions, and forming a protective layer overlying the sacrificial layer and the exposed non-contact-hole regions. Next, an inter-layer dielectric layer overlying the protective layer, and CMP (chemical mechanical polishing) is used to remove the inter-layer dielectric layer and the protective layer from above the photo resist. The photo resist layer is then removed from the contact-hole regions to expose contact holes.

20 Claims, 6 Drawing Sheets

METHOD FOR FORMING CONTACT HOLES IN A SEMICONDUCTOR DEVICE

CROSS-REFERENCES TO RELATED APPLICATIONS

This application claims priority to Chinese patent application No. 201410527831.4, filed on Oct. 9, 2014, the content of which is incorporated herein by reference in its entirety.

BACKGROUND OF THE INVENTION

The present invention relates to a semiconductor structure and method of manufacture, and more particularly to a method for forming contact structures.

Increasing demand of high-density low-cost non-volatile memory has driven aggressive scaling of feature sizes for flash memories. For NOR flash memory devices, the main scaling limitation has been the cell height, and the two main factors in the cell height are the drain spacing and the gate length. The drain spacing has only been scaled insignificantly as technology nodes migrate from 90 nm to 65 nm due to the complexity of the minimum spacing (pitch) in patterning one-dimensional array of the contact holes. Gate length scaling remains a challenge for the NOR flash cell due to the requirement of a high drain voltage during Channel Hot Electron (CHE) programming. The Self-Aligned Contact (SAC) structure may also have the above-described problems.

A manufacturing method of a self-aligned contact hole structure of a NOR-type flash memory of the prior art includes the following steps: depositing a dielectric layer over memory cells, performing a CMP on the dielectric layer, forming a contact hole mask, forming contact holes by dry etching, and depositing a metal layer to fill the contact holes.

In the above-described conventional manufacturing method, the drain space can be reduced by using lithography friendly line/space pitch characteristics, and the self-contact hole structure allows the drain plug to be near the gate sidewall, thereby reducing the dimension of the flash memory to a certain extent. However, the inventor has observed that, the conventional method uses dry etching to form self-aligned contact holes, which can cause undue etching to the device structure exposed to the etching, e.g., the gate sidewalls. Such damages can result in degraded device parameters, such as a lower breakdown voltage between a word line (WL) and a drain contact hole (Drain CT). Accordingly, the performance of the semiconductor device can suffer.

BRIEF SUMMARY OF THE INVENTION

In embodiments of the present invention, a method of forming contact holes includes forming a sacrificial layer in the contact hole regions and then, after forming an interlayer dielectric layer in the non-contact hole regions, removing the sacrificial layer to expose the contact holes. In contrast, in the conventional method, the interlayer dielectric layer is etched to form contact holes, which can cause damages to the contact hole structure. In embodiments of the invention, the process of forming contact holes no longer includes dry etching of the dielectric layer to open up the contact holes. As a result, unwanted etching of the side wall spacers on the gate structures can be avoided. Therefore, it is possible to improve the breakdown voltage between the word line and the contact hole, thereby increasing the overall performance and yield of the semiconductor device.

According to some embodiments of the present invention, a method for forming a semiconductor device includes forming a device structure having a floating gate, control gate, sidewall spacers, and source and drain regions. The device structure includes contact-hole regions and non-contact-hole regions. The method also includes forming a photo resist layer overlying the contact hole regions in the device structure and exposing the non-contact-hole regions, and forming a protective layer overlying the sacrificial layer and the exposed non-contact-hole regions. Next, an inter-layer dielectric layer overlying the protective layer, and CMP (chemical mechanical polishing) is used to remove the inter-layer dielectric layer and the protective layer from above the photo resist. The photo resist layer is then removed from the contact-hole regions to expose contact holes.

According to some embodiments of the present invention, a method for forming a semiconductor device includes forming a device structure including contact-hole regions and non-contact-hole regions, forming a sacrificial layer overlying the contact hole regions in the device structure and exposing the non-contact-hole regions, and forming an interlayer dielectric layer overlying the sacrificial layer. The method also includes using CMP (chemical mechanical polishing) to remove the inter-layer dielectric layer and the protective layer from above the sacrificial layer, and removing the sacrificial layer from the contact-hole regions to expose contact holes.

In an embodiment of the above method, the device structure comprises a floating gate, control gate, sidewall spacers, and source and drain regions.

In an embodiment, the sacrificial layer includes a polyimide material.

In an embodiment, the sacrificial layer comprises photo resist. The method includes forming a photo resist layer overlying the device structure and patterning the photo resist layer to cover the contact-hole regions and expose non-contact-hole regions. The method also includes using an ashing method to remove the sacrificial layer.

In an embodiment, the method includes, after forming the sacrificial layer, forming a protective layer overlying the sacrificial layer and the exposed non-contact-hole regions and forming an interlayer dielectric layer overlying the protective layer.

In an embodiment, the protective layer includes low-temperature silicon nitride.

In an embodiment, the device structure further includes a hard mask layer on the control gate layer.

In an embodiment, the method also includes forming a conductive material in the exposed contact holes to form contact plugs. For example, a titanium/titanium nitride stack is first formed in the contact holes, and then a tungsten layer is formed on the titanium/titanium nitride stack.

According to some embodiments, an electronic apparatus includes a semiconductor device and an electronic assembly connected to the semiconductor device. The semiconductor device is formed by a method that includes forming a device structure including contact-hole regions and non-contact-hole regions, forming a sacrificial layer overlying the contact hole regions in the device structure and exposing the non-contact-hole regions, and forming an interlayer dielectric layer overlying the sacrificial layer. The method also includes using CMP (chemical mechanical polishing) to remove the inter-layer dielectric layer and the protective layer from above the sacrificial layer, and removing the sacrificial layer from the contact-hole regions to expose contact holes.

The following description, together with the accompanying drawings, will provide a better understanding of the nature and advantages of the claimed invention.

DETAILED DESCRIPTION OF THE INVENTION

Figure 1:
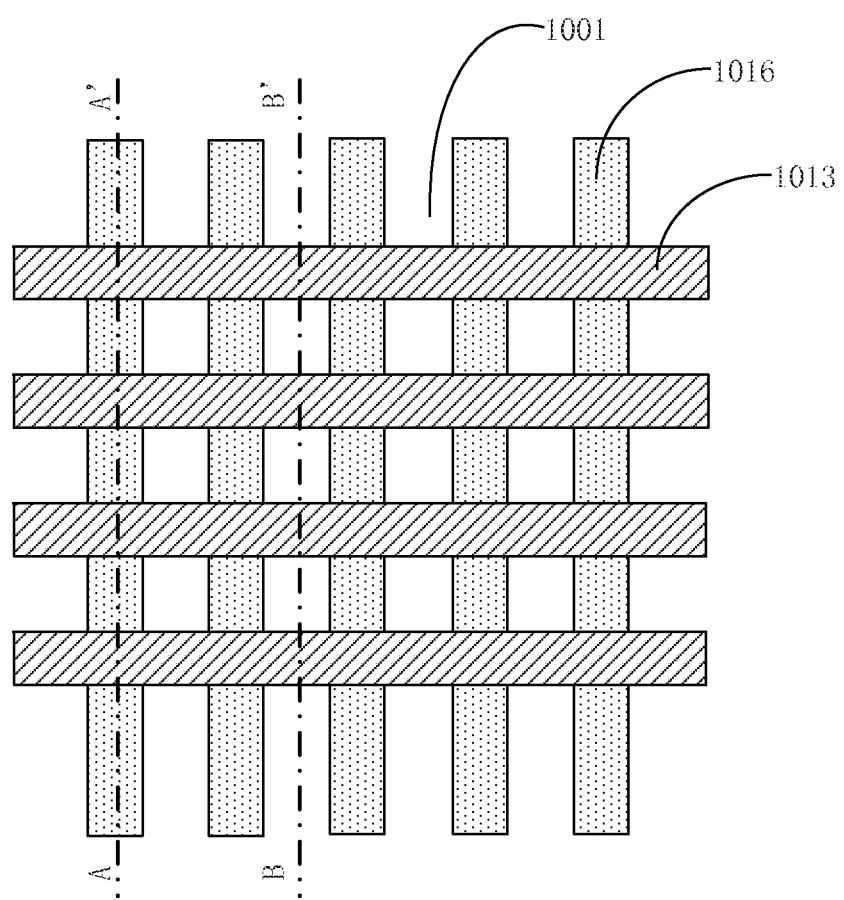
FIG. 1 is a top view diagram illustrating a method for forming a semiconductor device according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Some embodiments of the invention provide a method of manufacturing a semiconductor device including a NOR type flash memory, mainly related to improvement of the manufacturing process of the contact hole (CT). The method does not use a dry etching process to etch a dielectric to form a self-aligned contact (SAC) hole. As a result, the method does not cause undue etching or damage of the gate structures, such as the sidewall spacers, and can provide improved breakdown voltage between the word line and the contact holes.

FIG. 1 is a top view diagram illustrating a method for forming a semiconductor device according to an embodiment of the present invention, and FIGS. 2A-2H are cross-sectional view diagrams illustrating a method for forming a semiconductor device according to an embodiment of the present invention. As shown in FIG. 1, a NOR type memory array structure before contact hole formation can include isolation regions 1001, active regions 1016, and control gates 1013. Active regions 1016 can include source and drain electrodes 10161 and 10162 shown in FIG. 2A. In FIGS. 2A-2H, the left side is a cross-sectional view of the device structure in FIG. 1 taken along a line AA', and the right side is a cross-sectional view of the device structure in FIG. 1 taken along a line along a line BB'. The cut line AA' extends along the active region and is perpendicular to the control gates. The cut line BB' extends in the isolation region and is perpendicular to the control gates. The method for forming self-aligned contact holes is now described with reference to FIGS. 2A-2H.

Figure 2A:
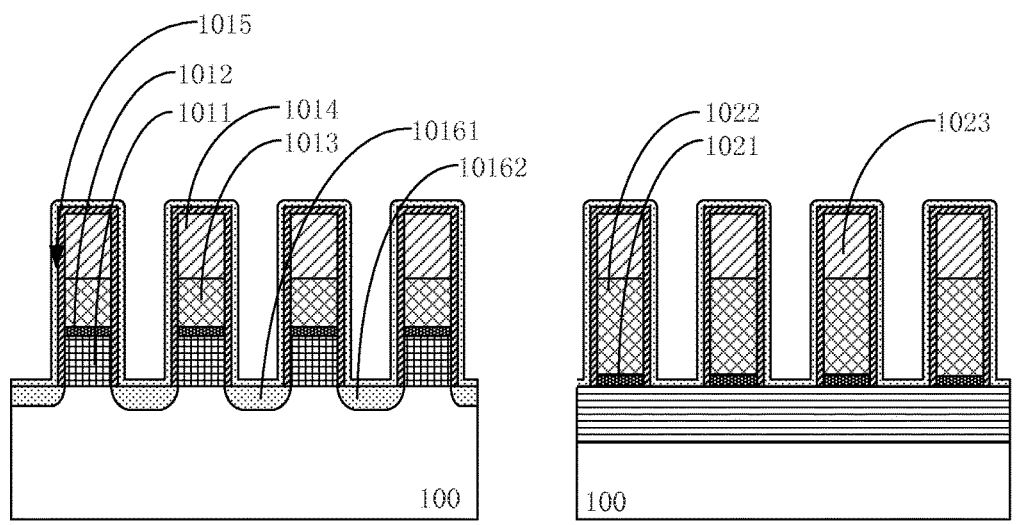
FIGS. 2A, 2B, 2C, 2D, 2E, 2F, 2G, and 2H are cross-sectional view diagrams illustrating a method for forming a semiconductor device according to an embodiment of the present invention.

At step A1, the method includes forming a device structure having a floating gate, control gate, sidewall spacers on the control gate sidewalls, and source and drain regions. As shown in FIG. 2A, along the cut line AA', the device structure includes floating gates 1011, control gates 1013, sidewall spacers 1015 on both sides of the floating gates and control gates, as well as source regions 10161 and drain regions 10162 formed on a substrate 100. In some embodiments, hard mask layer 1014 can be formed on control gates 1013. The right side of FIG. 2A also shows gate dielectric 1021, control gate electrode 1022, and hard mask 1023 along the cut line BB'. Note that gate dielectric can be the same as the dielectric between the floating gate and the substrate which is not shown on the left side of FIGS. 2A-2H.

Step A1 can include the following steps.
Forming floating gates on substrate;
Forming an inter-gate dielectric material, a control gate material layer, and a hard mask material layer;
Etching to form the inter-gate dielectric, the control gate, and the hard mask;
Forming sidewall spacers on the side walls of the inter-gate dielectric, the control gate, and the hard mask;
Performing ion implantation to form source regions 10161 and drain regions 10162.

In the above step, the floating gate material and control gate material can be polysilicon. The inter-gate dielectric material can be an ONO stack including silicon oxide, silicon nitride, and silicon oxide layers. The hard mask material can be silicon nitride. The sidewall spacers material can be silicon nitride or other suitable material.

In a conventional method, a dielectric layer would be deposited overlying the device structure in FIG. 2A, and an etching step would be carried out to remove the dielectric material from the contact holes regions. Such an etching step can cause damage to the underlying structure including the sidewall spacers. The damages can degrade device performance and lower the yield.

Figure 2B:
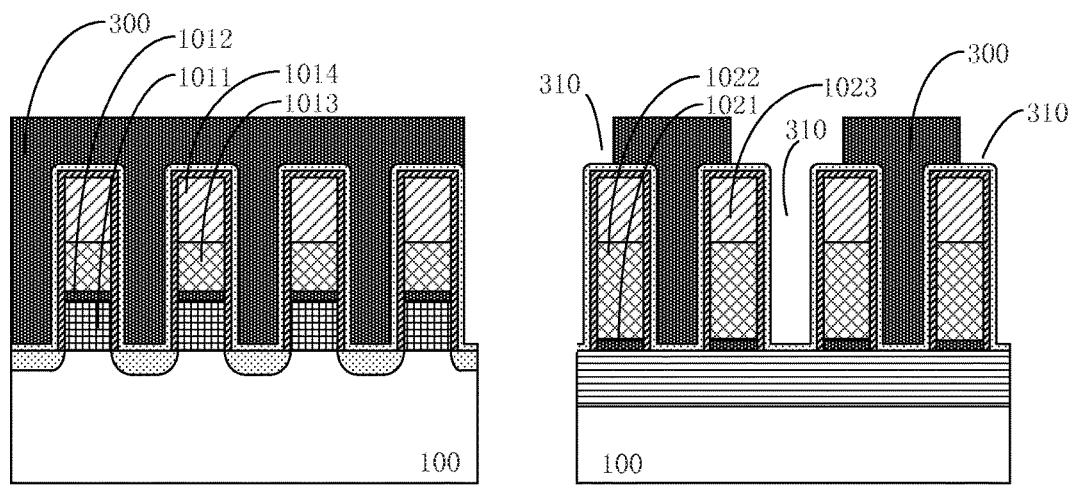

At step A2, the method includes forming a sacrificial layer overlying contact hole regions in the device structure formed in step A1 and exposing non-contact-hole regions. As shown in FIG. 2B, a sacrificial layer 300 can be photoresist. Other materials can also be used to form the sacrificial layer, such as polyimides or resins, which is easier to remove than sidewall spacers 1015. Such materials can be selected such that the removal of the sacrificial layer does not cause damage to the materials in sidewall spacers 1015. In some embodiments, a photo resist layer 300 is formed on the device structures formed above. The photo resist layer is patterned covering contact hole regions. As shown in the right side of FIG. 2B, the photo resist in the non-contact-hole regions 310 are removed in the photoresist pattering process.

Figure 2C:
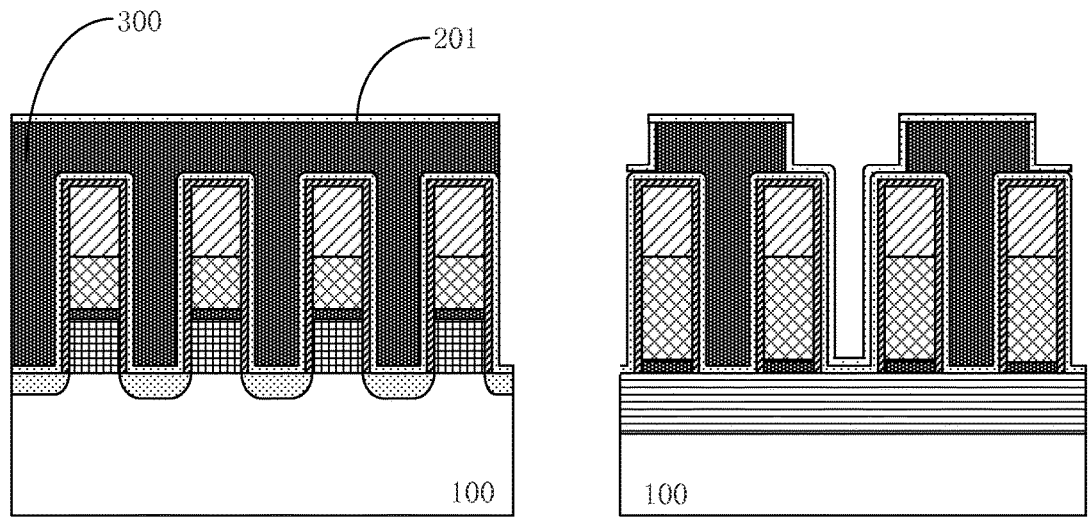
Figure 2D:
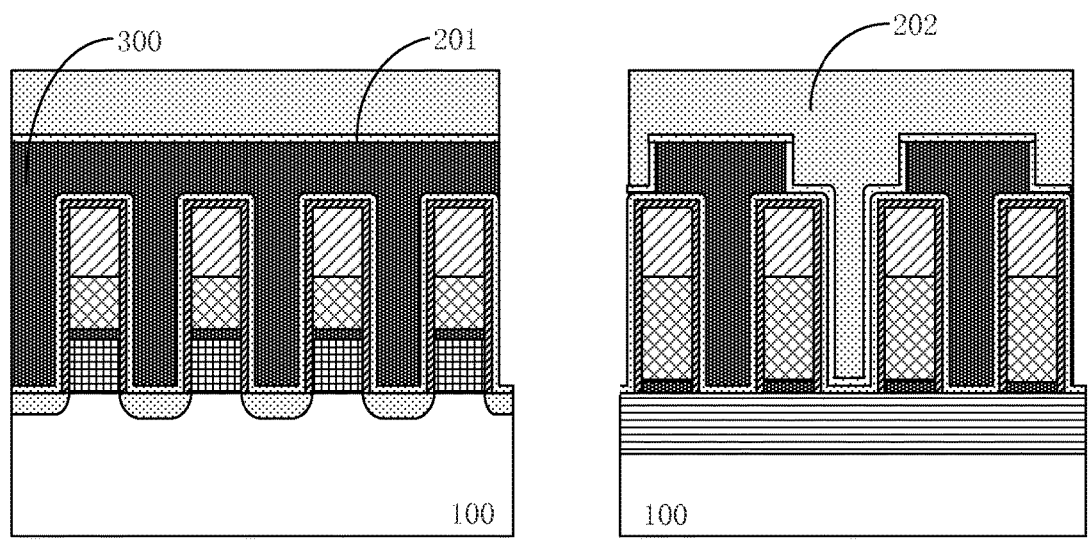

At step A3, the method includes forming a protective layer overlying the sacrificial layer and the exposed non-contact-hole regions, and forming an interlayer dielectric layer overlying the protective layer. As shown in FIG. 2C, a protective layer 201 is formed covering the sacrificial layer and the exposed non-contact-hole regions. The protective layer can be formed using low-temperature silicon nitride or other suitable materials. As shown in FIG. 2D, an interlayer dielectric layer 202 is formed overlying protective layer 201. The interlayer dielectric layer can be formed using silicon oxide or other suitable material using deposition or other suitable methods. In some embodiment, the step of forming protective layer 201 can be omitted, and interlayer dielectric layer 202 is formed on the sacrificial layer.

Figure 2E:
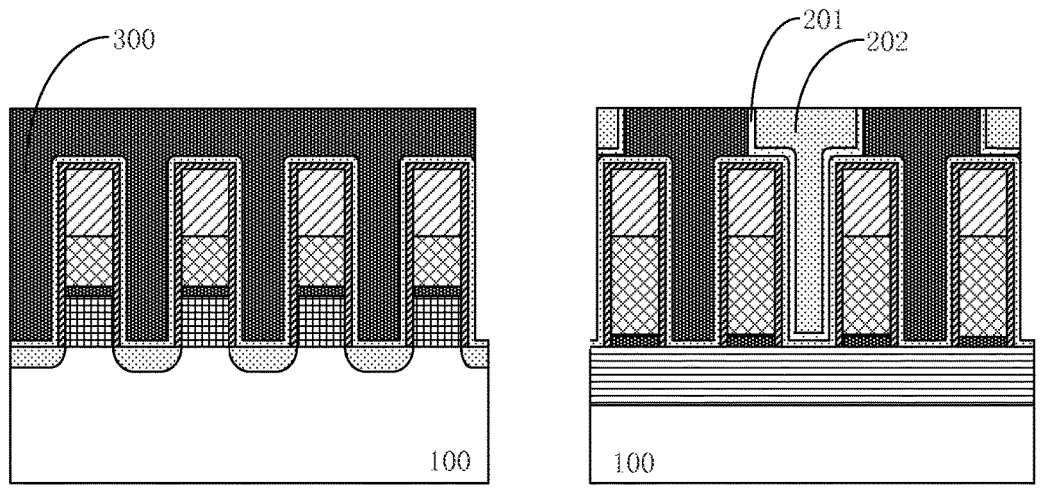

At step A4, the method includes using CMP (chemical mechanical polishing) to remove the inter-layer dielectric layer and the protective layer from above the sacrificial layer, as shown in FIG. 2E. In this step, the protective layer can offer protection to the sacrificial layer during the polishing step and improve the yield of the process. Of course, in embodiments that do not include the protective layer, there is no need to polish away the protective layer. It is noted that the method includes sufficient tolerance with regard to the remaining thickness of the sacrificial layer and inter-layer dielectric layer above the gate stack. In other words, some variations in this thickness would not have a detrimental effect on subsequent steps.

Figure 2F:
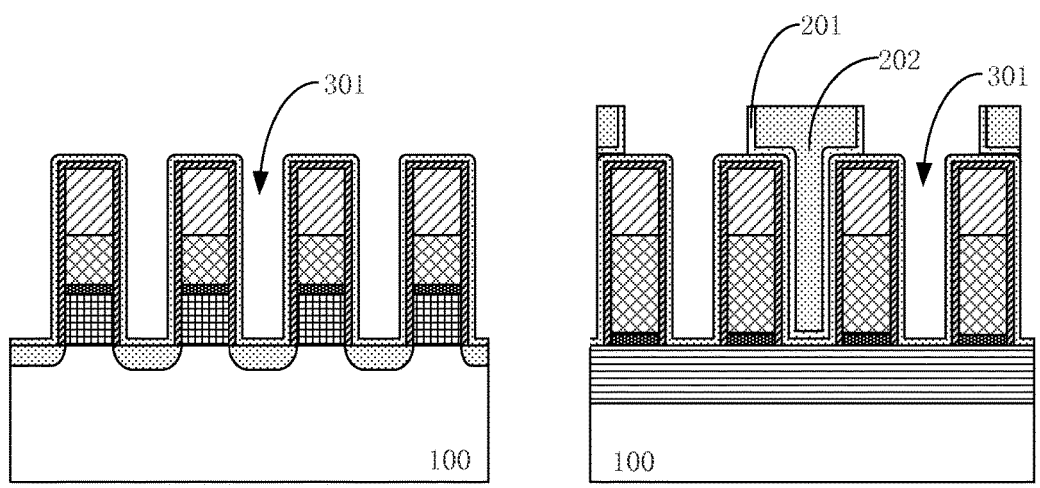

At step A5, the method includes removing the sacrificial layer from the contact-hole regions to form contact holes 301, as shown in FIG. 2F. If a photoresist is used as the sacrificial layer, it can be removed using an ashing process or wet photoresist removal. For other sacrificial materials, other methods can also be used, such as peeling, wet etch, ashing, etc. After the removal of the sacrificial layer, the method can further include the step of wet cleaning performed, which can remove impurities generated in the process, thereby improving the yield of the finally obtained semiconductor device.

In embodiments of the present invention, the method of forming contact holes includes forming a sacrificial layer in the contact hole regions and then, after forming an interlayer dielectric layer in the non-contact hole regions, removing the sacrificial layer to expose the contact holes. In contrast, in the conventional method, the interlayer dielectric layer is etched to form contact holes, which can cause damages to the contact hole structure. In embodiments of the invention, the process of forming contact holes no longer includes a dry etching process of the dielectric layer. As a result, unwanted etching of the side wall spacers on the control gate, floating gate, and hard mask can be avoided. Therefore, it is possible to improve the breakdown voltage between the word line and the contact hole, thereby increasing the overall performance and yield of the semiconductor device.

Figure 2G:
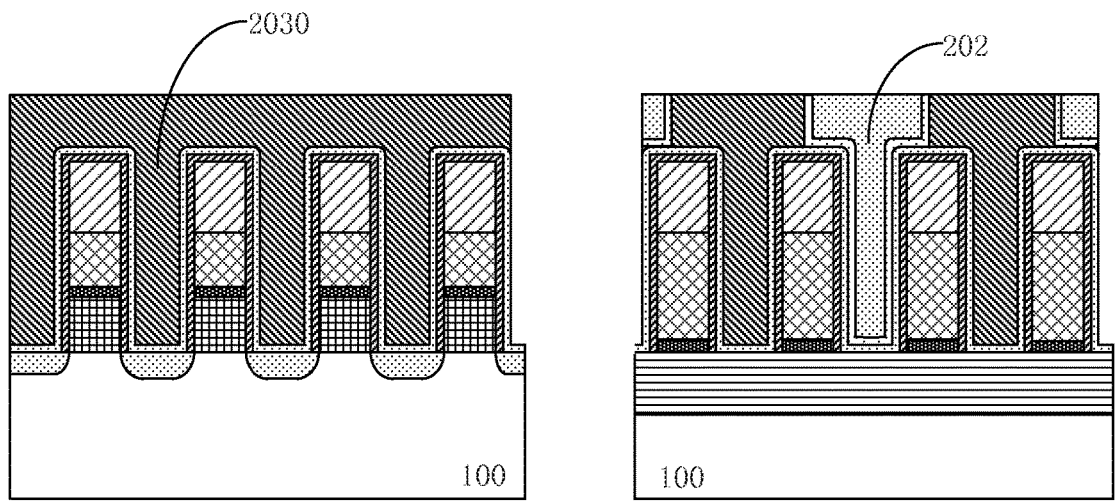
Figure 2H:
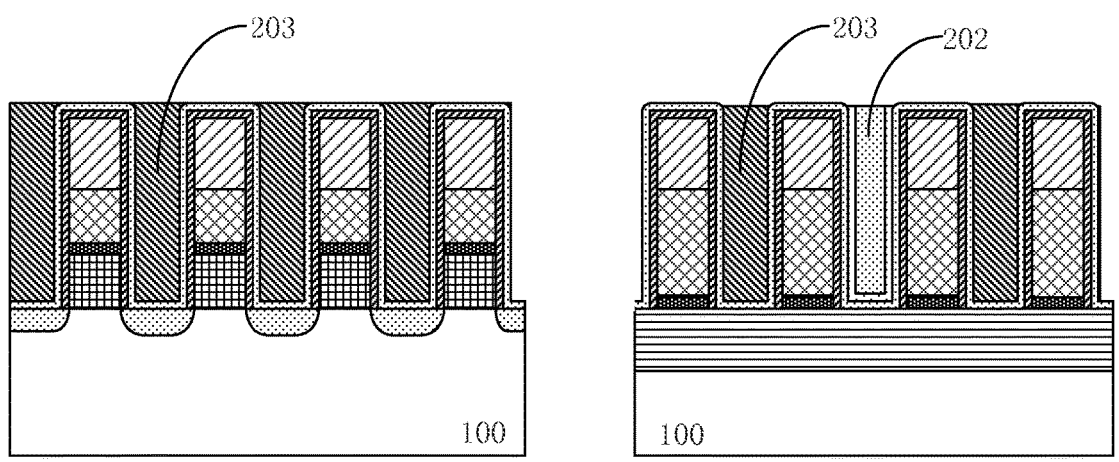

At step A6, the method includes forming a conductive layer 2030 overlying the contact holes previously filled with the sacrificial material, as shown in FIG. 2G. The method also includes using CMP to planarize the conductive layer to form contact plugs 203, as shown in FIG. 2H. The conductive layer can include a single layer or multilayer structure formed by deposition or other suitable methods. For example, the conductive material layer can include a tungsten (W) layer over a titanium/titanium nitride (Ti/TiN) stacked structure. The conductive plug 203 may be used to connect at its upper and lower components, e.g., the source electrode and the metal layer. The contact plugs can be used to connect various components, for example, the source region and an interconnect layer. The method can also include other steps for forming semiconductor devices, such as backend processes including forming metal interconnect structures, which are not described in detail here.

Figure 3:
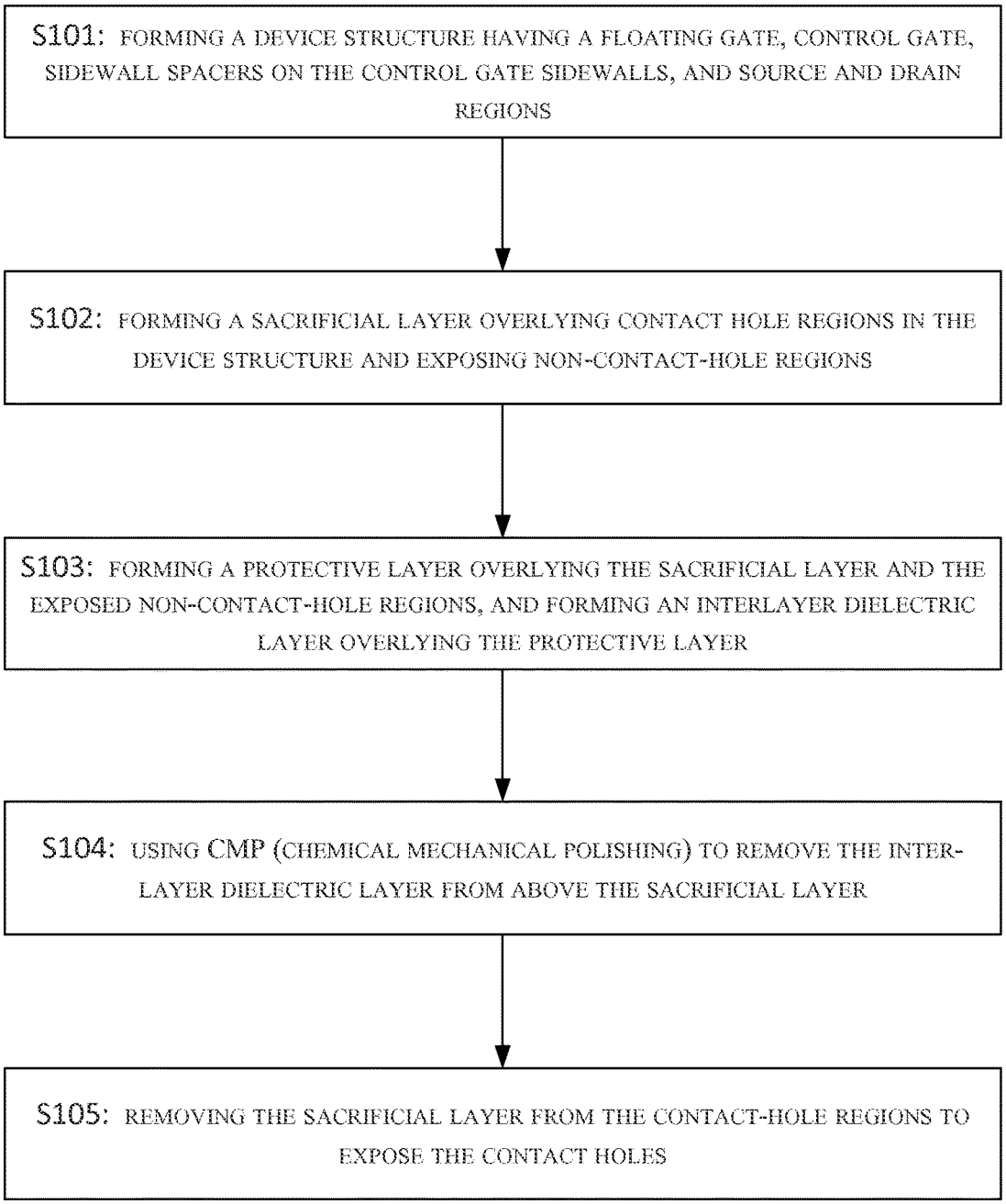
FIG. 3 is a flowchart illustrating a method for forming a semiconductor device according to an embodiment of the present invention.

FIG. 3 is a flowchart illustrating a method for forming a semiconductor device according to an embodiment of the present invention. The method can be summarized as follows.

At step S101, the method includes forming a device structure having a floating gate, control gate, sidewall spacers on the control gate sidewalls, and source and drain regions;

At step S102, the method includes forming a sacrificial layer overlying contact hole regions in the device structure formed in step A1 and exposing non-contact-hole regions;

At step S103, the method includes forming an interlayer dielectric layer overlying the protective layer. Optionally, the method can include, before forming the interlayer dielectric layer, forming a protective layer overlying the sacrificial layer and the exposed non-contact-hole regions;

At step S104, the method includes using CMP (chemical mechanical polishing) to remove the inter-layer dielectric layer (and, optionally, the protective layer) from above the sacrificial layer; and At step S105, the method includes removing the sacrificial layer from the contact-hole regions to expose the contact holes.

Another embodiment of the present invention provides an electronic device including a semiconductor device and an electronic assembly connected to said semiconductor device. The electronic assembly can include transistors or other electronic components. A method of manufacturing the semiconductor device has been described above and is now summarized below.

At step S101, the method includes forming a device structure having a floating gate, control gate, sidewall spacers on the control gate sidewalls, and source and drain regions;

At step S102, the method includes forming a sacrificial layer overlying contact hole regions in the device structure formed in step A1 and exposing non-contact-hole regions;

At step S103, the method includes forming an interlayer dielectric layer overlying the protective layer. Optionally, the method can include, before forming the interlayer dielectric layer, forming a protective layer overlying the sacrificial layer and the exposed non-contact-hole regions;

At step S104, the method includes using CMP (chemical mechanical polishing) to remove the inter-layer dielectric layer (and, optionally, the protective layer) from above the sacrificial layer; and At step S105, the method includes removing the sacrificial layer from the contact-hole regions to expose the contact holes.

In accordance with the present invention, the electronic device may be a mobile phone, a laptop computer, a netbook, a tablet PC, a game console, a TV receiver, a DVD player, a GPS device, a camera, a voice recorder, MP3, MP4, PSP players, and other semiconductor devices including intermediate products and electronic components that may include the above-described electrically programmable fuse device for faster programming speed.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for forming a semiconductor device, comprising:

forming a device structure including a floating gate, control gate, sidewall spacers, and source and drain regions, the device structure including contact-hole regions and non-contact-hole regions;

forming a sacrificial layer overlying the contact hole regions in the device structure and exposing the non-contact-hole regions;

forming a protective layer overlying the sacrificial layer and the exposed non-contact-hole regions;

forming an interlayer dielectric layer overlying the protective layer;

using CMP (chemical mechanical polishing) to remove the inter-layer dielectric layer and the protective layer from above the sacrificial layer; and removing the sacrificial layer from the contact-hole regions to expose contact holes.

2. The method of claim 1, wherein the sacrificial layer comprises photo resist, the method further comprising:

forming a photo resist layer overlying the device structure, and patterning the photo resist layer to cover the contact-hole regions and expose non-contact-hole regions.

3. The method of claim 1, further comprising using an ashing method to remove the sacrificial layer.

4. The method of claim 1, wherein the protective layer comprises low-temperature silicon nitride.

5. The method of claim 1, wherein the device structure further comprises a hard mask layer on the control gate layer.

6. The method of claim 1, further comprising:

forming a conductive material in the exposed contact holes to form contact plugs.

7. The method of claim 6, further comprising:

forming a titanium/titanium nitride stack in the contact holes; and forming a tungsten layer on the titanium/titanium nitride stack.

8. The method of claim 1, further comprising a wet clean process after removing the sacrificial layer.

9. A method for forming a semiconductor device, comprising:

forming a device structure including contact-hole regions and non-contact-hole regions;

forming a sacrificial layer overlying the contact hole regions in the device structure and exposing the non-contact-hole regions;

forming an interlayer dielectric layer overlying the sacrificial layer;

using CMP (chemical mechanical polishing) to remove the inter-layer dielectric layer from above the sacrificial layer; and removing the sacrificial layer from the contact-hole regions to expose contact holes.

10. The method of claim 9, wherein the device structure comprises a floating gate, control gate, sidewall spacers, and source and drain regions.

11. The method of claim 9, wherein the sacrificial layer comprises a polyimide material.

12. The method of claim 9, wherein the sacrificial layer comprises photo resist.

13. The method of claim 12, further comprising:

forming a photo resist layer overlying the device structure, and patterning the photo resist layer to cover the contact-hole regions and expose non-contact-hole regions.

14. The method of claim 9, further comprising using an ashing method to remove the sacrificial layer.

15. The method of claim 9, further comprising, after forming the sacrificial layer, forming a protective layer overlying the sacrificial layer and the exposed non-contact-hole regions; and forming an interlayer dielectric layer overlying the protective layer.

16. The method of claim 15, wherein the protective layer comprises low-temperature silicon nitride.

17. The method of claim 9, wherein the device structure further comprises a hard mask layer on the control gate layer.

18. The method of claim 9, further comprising:

forming a conductive material in the exposed contact holes to form contact plugs.

19. The method of claim 18, further comprising:

forming a titanium/titanium nitride stack in the contact holes; and forming a tungsten layer on the titanium/titanium nitride stack.

20. An electronic apparatus, comprising a semiconductor device and an electronic assembly connected to the semiconductor device, wherein the semiconductor device is formed using a method that includes:

forming a device structure including contact-hole regions and non-contact-hole regions;

forming a sacrificial layer overlying the contact hole regions in the device structure and exposing the non-contact-hole regions;

forming a protective layer overlying the sacrificial layer and the exposed non-contact-hole regions;

forming an interlayer dielectric layer overlying the sacrificial layer;

using CMP (chemical mechanical polishing) to remove the inter-layer dielectric layer and the protective layer from above the sacrificial layer; and removing the sacrificial layer from the contact-hole regions to expose contact holes.

* * * * *